(12) United States Patent
Wang et al.

(10) Patent No.: US 10,794,774 B2
(45) Date of Patent: Oct. 6, 2020

(54) SPINTRONIC TEMPERATURE SENSOR

(71) Applicant: Regents of the University of Minnesota, Minneapolis, MN (US)

(72) Inventors: Jian-Ping Wang, Shoreview, MN (US); Yanfeng Jiang, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 291 days.

(21) Appl. No.: 15/828,976

(22) Filed: Dec. 1, 2017

(65) Prior Publication Data

US 2018/0156672 A1     Jun. 7, 2018

Related U.S. Application Data

(60) Provisional application No. 62/429,301, filed on Dec. 2, 2016.

(51) Int. Cl.
| | |
|---|---|
| G01K 7/00 | (2006.01) |
| G01K 1/00 | (2006.01) |
| G01K 7/36 | (2006.01) |
| H01L 43/10 | (2006.01) |
| G01K 7/16 | (2006.01) |
| H01L 43/08 | (2006.01) |

(52) U.S. Cl.
CPC ............ G01K 7/36 (2013.01); G01K 7/16 (2013.01); H01L 43/10 (2013.01); H01L 43/08 (2013.01)

(58) Field of Classification Search
USPC ....................................... 374/163, 100, 178
See application file for complete search history.

(56) References Cited

U.S. PATENT DOCUMENTS

| | | | |
|---|---|---|---|
| 2007/0077664 A1* | 4/2007 | Chung | H01L 27/228 438/2 |
| 2017/0229163 A1* | 8/2017 | Sasaki | G11C 11/161 |
| 2019/0074432 A1* | 3/2019 | Kumar | B82Y 10/00 |

OTHER PUBLICATIONS

Allwood, et al., "Magnetic Domain-Wall Logic," Science, vol. 309, Sep. 2005, pp. 1688-1692.
Kishi, et al., "Lower-current and Fast switching of a Perpendicular TMR for High Sped and High density Spin-Transfer-Torque MRAM," in IEDM 20008, Jan. 2009, 4 pp.
Kaka, et al., "Mutual phase-locking of microwave spin torque nanooscillators," Nature, vol. 437, Sep. 2005, pp. 389-392.
Jiang, et al., "Magnetic Tunnel Junction-Based Spin Register for Nonvolatile Integrated Circuits," IEEE Transaction Electron Devices, vol. 59, Nov. 2012, pp. 2917-2923.

(Continued)

*Primary Examiner* — Mirellys Jagan
(74) *Attorney, Agent, or Firm* — Shumaker & Sieffert, P.A.

(57) ABSTRACT

This disclosure describes various examples of spintronic temperature sensors. The example temperature sensors may be discrete or used to adaptively control operation of a component such as an integrated circuit (IC). In one example, an electronic device comprises a spintronic component configured such that the conductance of the spintronic component is based on sensed temperature. In one example, circuitry coupled to the spintronic component is configured to generate an electrical signal indicative of the sensed temperature based on the conductance of the spintronic component.

26 Claims, 13 Drawing Sheets

(56) References Cited

OTHER PUBLICATIONS

Lyle, et al., "Direct communication between magnetic tunnel junctions for nonvolatile logic fan-out architecture," Applied Physics Letters, vol. 97, Oct. 2010; pp. 152504-1-152504-152504-3.

Szekely, et al., "CMOS temperature sensors and built-in test circuitry for thermal testing of IC's" Sensors and Actuators A, vol. 71, 1998, pp. 10-18.

Shang, et al., "Temperature dependence of magnetoresistance and surface magnetization in ferromatgnetic tunnel junctions," Physical Reviews B, vol. 58, Aug. 1998, pp. R2917-2918.

Krivorotov, et al., "Time-Domain Measurements of Nanomagnet Dynamics Driven by Spin-Transfer Torques," Science, vol. 307, Sep. 2005, pp. 228-231.

Sun, et al., "Effects of FE doping in $La_{0.67}Sr_{0.3}CoO_3$," vol. 62, No. 9, Sep. 2000, pp. 5289-5292.

* cited by examiner

SPINTRONIC TEMPERATURE SENSOR

This application claims the benefit of U.S. Provisional Patent Application No. 62/429,301, filed Dec. 2, 2016, the entire content of which is incorporated by reference herein.

GOVERNMENT INTEREST

This invention was made with government support under DMR-0819885 awarded by National Science Foundation. The government has certain rights in the invention.

TECHNICAL FIELD

The disclosure relates to temperature sensors.

BACKGROUND

CMOS technology is continuing achieve improvement in performance and integration density. However, high power density on die may limit transistor scaling and further improvements. Also, increasing power density increases die temperature and may impact circuit operation. Absolute temperature sensors may be used to monitor the working temperature of an integrated circuit (IC).

SUMMARY

This disclosure describes examples for temperature sensing using spintronic components to provide an accurate, real-time indication of a sensed temperature. In examples described in this disclosure, spintronic components may be configured such that an electrical characteristic, such as conductance, varies (e.g., proportionally) to sensed temperature (e.g., temperature of area proximate to the spintronic component). Moreover, the spintronic components may be configured such that the electrical characteristic (e.g., conductance) may change relatively fast for fluctuations in temperature, providing for very fast response to temperature changes. Circuitry coupled to the spintronic components may generate electrical signals indicative of the sensed temperature based on the conductance, as one example.

In one example, the disclosure describes an electronic device comprising a spintronic component configured such that a conductance of the spintronic component is based on sensed temperature, and circuitry coupled to the spintronic component configured to generate an electrical signal indicative of the sensed temperature based on the conductance of the spintronic component.

In one example, the disclosure describes a method for temperature sensing, the method comprising generating a voltage at a spintronic component based on a conductance of the spintronic component, wherein the spintronic component is configured such that the conductance of the spintronic component is based on sensed temperature, generating an electrical signal indicative of the sensed temperature based on the voltage at the spintronic component, and controlling operation of an electronic device based on the generated electrical signal.

The details of one or more aspects of the disclosure are set forth in the accompanying drawings and the description below. Other features, objects, and advantages of the disclosure will be apparent from the description and drawings, and from the claims.

DETAILED DESCRIPTION

Figure 1:
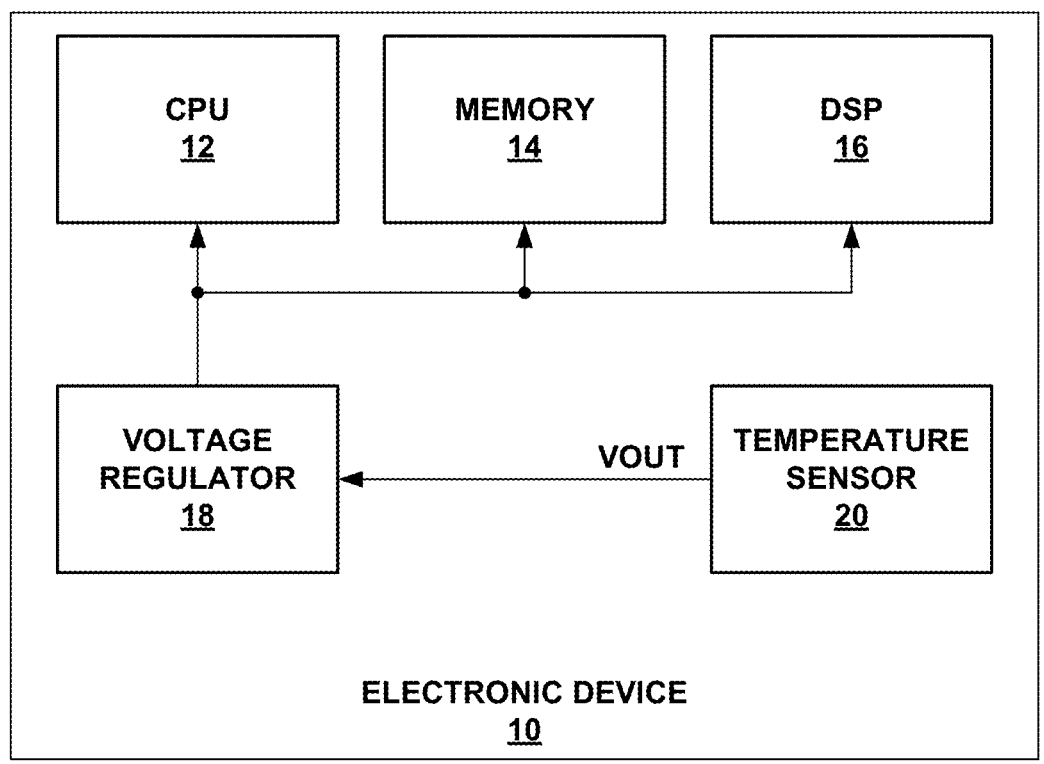
FIG. 1 is a block diagram illustrating an example electronic device that includes a temperature sensor.

FIG. 1 is a block diagram illustrating an example electronic device that includes a temperature sensor formed with one or more spintronic components. In the example, electronic device 10 includes central processing unit (CPU) 12, memory 14, digital signal processor (DSP), voltage regulator 18, and temperature sensor 20. Device 10 may include more or fewer components than those illustrated in FIG. 1. Device 10 may form an integrated circuit (IC) and part of various larger devices like a mobile device, a laptop computer, a desktop, and the like. Device 10 of FIG. 1 is an example of a system of chip (SoC) that includes various components for processing. Other examples of device 10 may include power driver ICs.

In some examples described in this disclosure, temperature sensor 20 generates output indicative of the sensed temperature. The sensed temperature refers to the temperature at device 10, as one example. In general, the sensed temperature may refer to the temperature surrounding temperature sensor 20, which may be the ambient temperature is some examples. For instance, temperature sensor 20 may output a signal indicative of the temperature of device 10. Although temperature sensor 20 is illustrated as internal to device 10, in some examples, temperature sensor 20 may be its own separate circuit, chip or device that outputs a signal indicative of sensed temperature.

There may be various purposes for determining the real-working temperature at device 10 (e.g., sensed temperature). In some examples, high temperature may be indicative of malfunction of device 10. As one example, leakage current in device 10, or possibly some short-circuit, may be cause device 10 to heat. In FIG. 1, voltage regulator 18 receives power from a battery (not shown) and outputs a constant voltage to the components of device 10. In some examples, the output of temperature sensor 20 may control the operation of voltage regulator 18. As illustrated, temperature sensor 20 outputs a signal $V_{OUT}$ indicative of the sensed temperature, and control the operation of voltage regulator 18.

For example, if the temperature becomes too high, temperature sensor 20 may turn off the operation of voltage regulator 18, and thereby turn off power to the components of device 10. As another example, the voltage level of the voltage that voltage regulator 18 outputs may be based on the output of temperature sensor 20.

Device 10 cool downs when voltage regulator 18 stops delivering power or when voltage regulator 18 reduces the voltage delivered to components of device 10. For example, where voltage regulator 18 scales the output voltage based on the output from temperature sensor 20, device 10 cools down from the reduced power consumption due of the reduction in the delivered power from voltage regulator 18.

In this example, CPU 12, memory 14, and DSP 16 may be considered as controlled circuits that receive power from voltage regulator 18. The heat generated by the controlled circuits or other components is sensed by temperature sensor 20, and in response, temperature sensor 20 outputs a signal indicative of the temperature. In some examples, the signal that temperature sensor 20 outputs controls whether voltage regulator 18 delivers power to the controlled circuits. In some examples, the signal that temperature sensor 20 outputs controls the voltage level of the voltage that voltage regulator 18 outputs. Accordingly, FIG. 1 illustrates an example where temperature sensor 20 can be adopted in a power source scaling strategy to cool down device 10 in an effective way.

Although illustrated separately, in some examples, temperature sensor 20 may be part of CPU 12, memory 14, and/or DSP 16. As one example, if CPU 12, memory 14, and/or DSP 16 are formed with spintronic devices (e.g., devices whose state is controlled by spin of currents), temperature sensor 20 may be part of CPU 12, memory 14, and/or DSP 16. However, it is not required for CPU 12, memory 14, and/or DSP 16 to be formed with spintronic devices for temperature sensor 20 to be part of CPU 12, memory 14, and/or DSP 16. In examples where temperature sensor 20 is part of CPU 12, memory 14, and/or DSP 16, the sensed temperature may be the temperature at CPU 12, memory 14, and/or DSP 16. As described, the sensed temperature may be the temperature of areas proximate to temperature sensor 20.

There may be other purposes for determining the temperature at device 10. Using the temperature measurement to selectively turn on and off the controlled circuits via voltage regulator 18 is one example.

As further described herein, in various example implementations, temperature sensor 20 is constructed to include one or more spintronic components. Spintronic components, as used herein, refer to components where spin of a current (e.g., electrons in a current) can be used to set magnetization states of the spintronic component. As one example, temperature sensor 20 may include a magnetic tunnel junction (MTJ) device that includes a free layer and a fixed layer sandwiched by an insulator layer. A magnetization direction of the fixed layer cannot be changed, but a magnetization direction of the free layer can be changed. When the magnetization direction of the fixed layer and the free layer is the same, the MTJ device, which is an example of a spintronic device, is referred to being in a parallel magnetization state. When the magnetization direction of the fixed layer and the free layer is the opposite, the MTJ device is referred to being in an anti-parallel magnetization state.

One example of an MTJ device is a spin-transfer torque operated MTJ (STT-MTJ). In an example of STT-MTJ, current flowing through the MTJ sets the magnetization state. As an example, current flowing through the MTJ in a first direction applies a torque on the free layer, and sets the magnetization direction of the free layer to be the same as the magnetization direction of the fixed layer (e.g., places the STT-MTJ in the parallel magnetization state). Current flowing through the MTJ in a second, opposite direction applies an opposite torque on the free layer, and sets the magnetization direction of the free layer to the opposite as the magnetization direction of the fixed layer (e.g., places the STT-MTJ in the anti-parallel magnetization state).

Although the example is described with respect to an STT-MTJ, the techniques are not so limited. The techniques may be applicable to MTJs in addition to STT-MTJs. For example, for some MTJs, the magnetization state may be set by current flowing through a spin channel (e.g., set the magnetization state based on spin wave, spin Hall effect and/or Rashiba effect). The magnetization sate may be set by other means such as the voltage controlled magnetic anisotropy (VCMA) and the magnetic electrical (ME) effect. Other examples of spintronic components include a giant magnetoresistance (GMR) device. Another example of a spintronic component is a topological insulator-based MTJ device. The techniques described in this disclosure may be applicable to MTJs, GMRs, or other types of spintronic components.

STT-MTJ devices described herein may be suitable components for temperature sensor 20 because the devices can be constructed such that the conductance (i.e., inverse of resistance) of an STT-MTJ device, as one example, varies in response to changes in temperatures. In some examples, as described herein, the STT-MTJ device can be placed in the anti-parallel state and the conductance of the STT-MTJ device may be used to sense changes in the temperature (e.g., increases over temperature or decreases over temperature). If the STT-MTJ device is placed in the parallel state, the STT-MTJ device may be configured such that the conductance of the STT-MTJ device is constant over temperature. However, in some examples of spintronic components, including some examples of STT-MTJ devices, the conductance of the spintronic component may be constant over temperature in the anti-parallel magnetization state, and increasing or decreasing over temperature in the parallel magnetization state.

In some examples, temperature sensor 20 that uses spintronic components for sensing temperature may provide for faster temperature recognition than some other temperature sensor types, such as electron diffusion in CMOS technology. For instance, because the temperature-dependent tunnel magneto-resistance in the MTJ is related to spin wave excitation, the thermal reaction speed of the MTJ may be much faster than that of electron diffusion.

For instance, some conventional temperature sensors compatible with CMOS technology include parasitic lateral or substrate bipolar transistor, MOS transistor, ring-oscillator, etc. For bipolar transistors, the conventional temperature sensors use two diode-connected substrate PNP transistors to generate voltage VBE and delta VBE, and these voltages are combined to produce Proportional To Absolute Temperature (PTAT) and reference voltages. The PTAT and reference voltages are converted to a digital temperature reading DOUT using an analog-to-digital converter (ADC). The operation of the CMOS based temperature sensor is based on electron movement from emitter to collector.

These example sensors provide some level of accuracy, low power consumption and reasonable temperature range. However, since the mechanism of these temperature sensors is all based on diffusion of electrons, they have relative slow sample speed in terms of thermal transit response and cannot reflect temperature in an effective way. Temperature sensor 20 may provide, in some examples but not necessarily in all examples, faster thermal transit speed as compared to some examples of temperature sensors developed with CMOS.

The faster thermal response of temperature sensor 20, as compared to CMOS technology, may be beneficial for various reasons. As one example, by immediate detection of change in temperature, temperature sensor 20 may more quickly cause voltage regulator 18 to turn off power to the controlled circuits as compared to a temperature sensor developed using CMOS technology. In general, temperature sensor 20 may provide a more accurate temperature reading for an exact moment, as compared to a temperature sensor developed using CMOS technology, because there is lag in the temperature sensing in CMOS technology as compared to spintronic components of temperature sensor 20.

The above is an example for an application of temperature sensor 20 on adaptive temperature control of device 10. In FIG. 1, temperature sensor 20 is used to regulate the supply voltage of voltage regulator 18. In some examples, such as where device 10 is a power driver IC, device 10 may be used in current driving mode, working in high voltage (>40 V) and large current (>100 mA). Its die temperature may always be higher than 120° C. Cooling down such kind of IC is helpful to improve its life time and reliability. One example of cooling down this power drive IC by using temperature sensor 20 to control whether voltage regulator 18 supplies voltage to the controlled circuits. Temperature sensor 20 may continuously measures the die temperature of device 10. Then, voltage regulator 18 may adaptively change the supply voltage of device 10 according to the measured die temperature. Scaling the supply voltage reduces both the dynamic and leakage power of the chip. In this way, the die temperature can be in a controllable manner.

Figure 2:
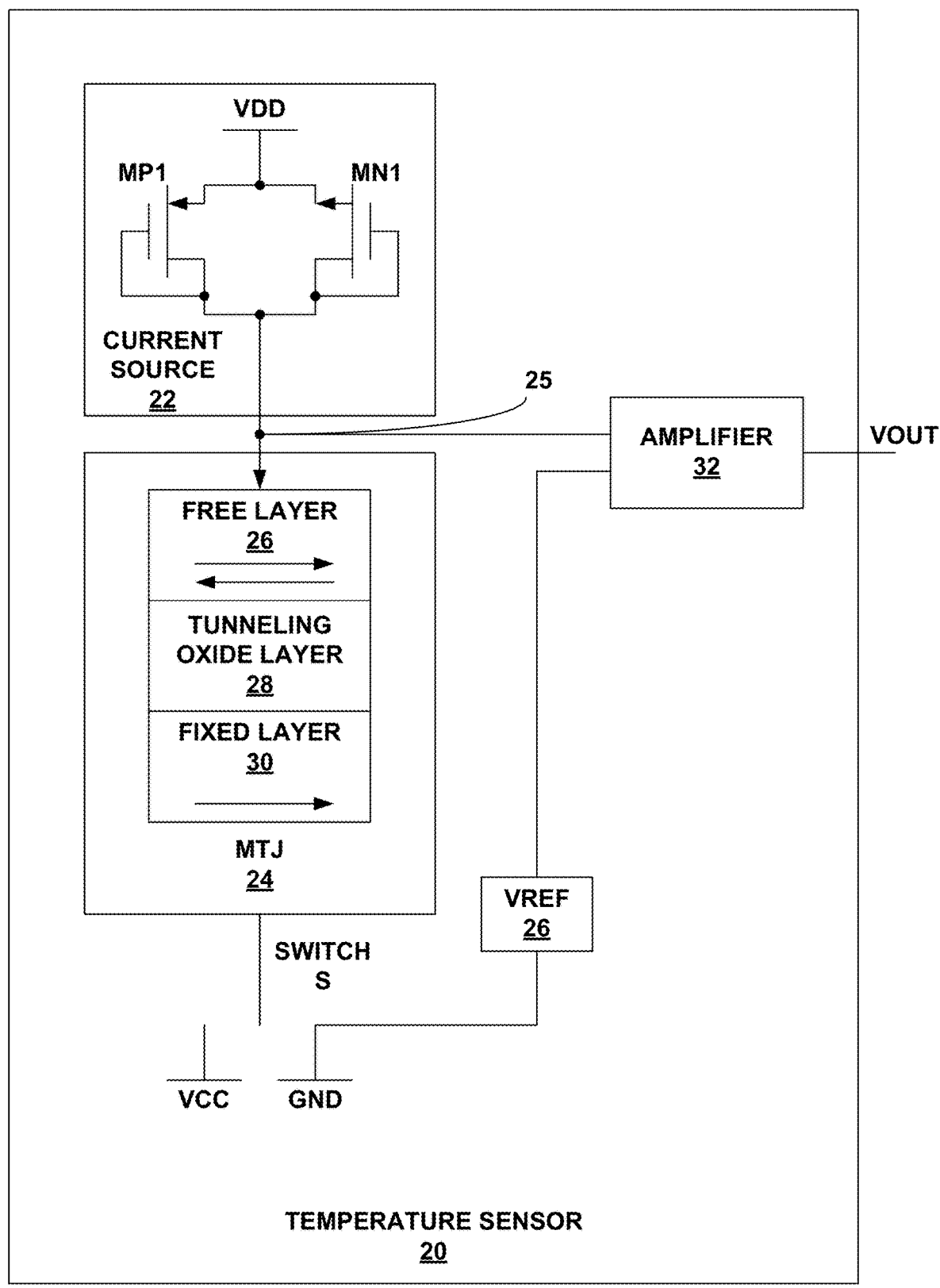
FIG. 2 is a block diagram illustrating an example temperature sensor in accordance with this disclosure.

FIG. 2 is a block diagram illustrating an example temperature sensor in accordance with this disclosure. In FIG. 2, temperature sensor 20 includes current source 22 and MTJ device 24 (e.g., STT-MTJ device 24).

Current source 22 is one example of a current source, and other examples of current sources are possible. In FIG. 2, transistor MP1 is a pMOS transistor that always stays in a saturation state. Current flows from VDD, through MP1, MTJ device 24, and ground when switch S is connected to ground. As illustrated, MTJ device 24 includes free layer 26, tunneling oxide layer 28, and fixed layer 30.

In some examples, MTJ device 24 may have been, e.g., during manufacturing or initialization, placed in the anti-parallel state by running current through MTJ device 24 that causes free layer 26 to be magnetized in the opposite direction relative to fixed layer 30. Once in the anti-parallel state, MTJ device 24 may remain in the anti-parallel state until sufficient current flows through to cause the magnetization direction of free layer 26 to switch. In one or more examples, the amplitude of the current that current source 22 outputs may not be sufficient to cause the magnetization direction of free layer 26 to switch.

However, the current that current source 22 outputs does generate a voltage at node 25. The conductance of MTJ device 24 may be based on whether MTJ device 24 is in the anti-parallel or parallel magnetization state. In the parallel magnetization state, the conductance of MTJ device 24 is at a first level, and in the parallel magnetization stage, the conductance of MTJ device 24 is at a second level. The first level may be greater than the second level. In other words, the resistance of MTJ device 24 in the parallel magnetization state is less than the resistance of MTJ device 24 in the anti-parallel magnetization state.

In addition, the conductance of MTJ device 24 may be based on the sensed temperature (e.g., temperature proximate to MTJ device 24 such as temperature of device 10). As an example, MTJ device 24 may be configured such that a conductance of MTJ device 24 is based on sensed temperature. For instance, if MTJ device 24 is in a first state (e.g., anti-parallel magnetization state), the conductance of MTJ device 24 may change based on the sensed temperature. Therefore, the voltage at node 25 may change based on the sensed temperature. Accordingly, in some examples, the voltage at node 25 may be indicative of the sensed temperature of device 10.

The amplitude of the voltage at node 25 may not be sufficiently high to measure or control the functionality of voltage regulator 18. Accordingly, in some examples, temperature sensor 20 may include amplifier 32 to amplify the voltage at node 25 and generate an output voltage (e.g., signal) indicative of the sensed temperature. This output voltage $V_{OUT}$ may control the operation of voltage regulator 18 as described above.

In some examples, because of inter-die process variation, the voltage at node 25 may be subtracted from a reference voltage generated from reference voltage source ($V_{REF}$) 26. In such examples, amplifier 32 may be configured as a difference amplifier that determines the difference between the voltage at node 25 and the voltage from $V_{REF}$ 26 to generate an output voltage indicative of the sensed temperature. $V_{REF}$ 26 and amplifier 32 configured as a difference amplifier may not be necessary in every example. One example of a difference amplifier is illustrated in more detail in FIG. 4.

Accordingly, FIG. 2 illustrates a schematic of one example of STT-MTJ temperature sensor 20, including a correction method for inter-die process variation. In FIG. 2, MTJ device 24 is set in the anti-parallel magnetization state during temperature measurement. Since conductance of MTJ device 24 depends on sensed temperature, the voltage at node 25 can reflect the temperature variation directly.

The voltage level of $V_{REF}$ 26 may be set based on calibration measurements of the inter-die process variation. By using $V_{REF}$ 26 and difference amplifier 32, the effect of inter-die process variation is significantly minimized by the calibration procedure.

Accordingly, FIG. 2 illustrates an example of a device that includes a spintronic component (e.g., STT-MTJ device 26), and circuitry (e.g., amplifier 32) coupled to MTJ device 26 configured to generate an electrical signal (e.g., voltage at node 25 or $V_{OUT}$) indicative of sensed temperature at device 10 based on a conductance of the spintronic component. In FIG. 2, MTJ device 26 is in an anti-parallel magnetization state, where in the anti-parallel magnetization state, a magnetization direction of a first layer (e.g., free layer 26) and a second layer (e.g., fixed layer 30) of MTJ device 24 is different.

As illustrated, in FIG. 2, the device 10 may include a current source 22 (e.g., MP1, MN1) configured to output a current through MTJ device 24 generating a voltage at node 25 of MTJ device 24, where the voltage at node 25 is based on the conductance of MTJ device 24. The circuitry (e.g., amplifier 32) may be configured to receive the voltage at node 25 of MTJ device 24 (e.g., the output) and generate the electrical signal indicative of the sensed temperature at device 10.

In some examples, temperature sensor 20 may include a $V_{REF}$ 26 to calibrate the voltage at MTJ device 24. The circuitry (e.g., amplifier 32 configured as a difference amplifier) is configured to receive the voltage at node 25 of MTJ device 24 and the reference voltage from $V_{REF}$ 26 and generate the electrical signal indicative of the sensed temperature at the device.

Tunneling oxide layer 28 may be formed as a MgO layer. In some examples, the conductance of MTJ device 24 may be based on thickness of MgO layer. For instance, an amount of change in the conductance of MTJ device 24 due to a change in the sensed temperature is based on a thickness of the MgO layer).

Figure 3:
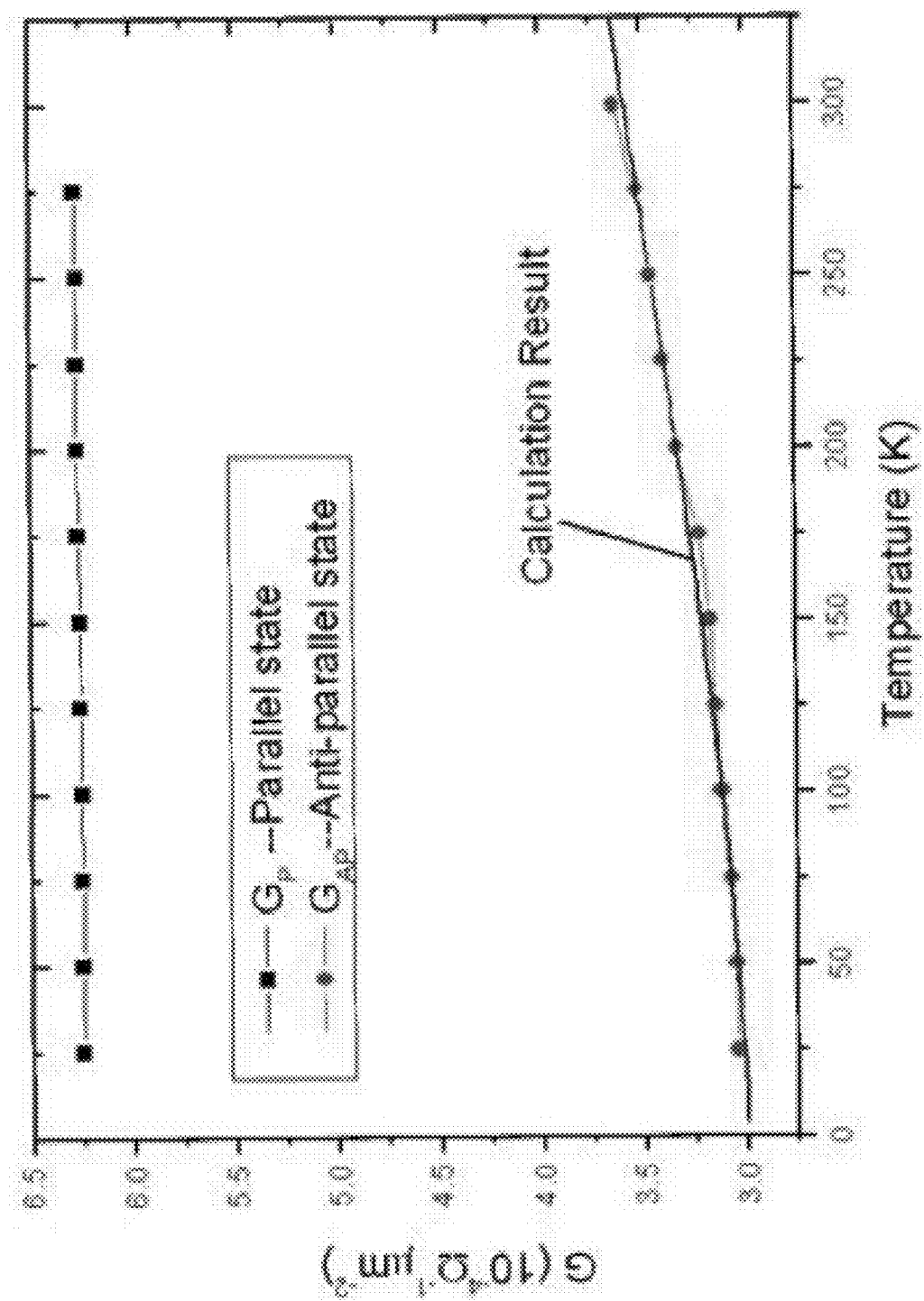
FIG. 3 is a graph illustrating a dependence of parallel and anti-parallel magnetization state conductance of a magnetic tunnel junction (MTJ) device on temperature.

FIG. 3 is a graph illustrating a dependence of parallel and anti-parallel magnetization state conductance of an MTJ device on temperature. The example MTJ device configured such that its conductance is based on sensed temperature and used to generate this data is illustrated in more detail with respect to FIG. 9A. FIG. 3 includes both measured data for the MTJ device, and calculated values. FIG. 3 illustrates conductance (G) for both MTJ device 24 in the parallel and anti-parallel magnetization state versus temperature based on actual measurement and theory analysis. The conductance in the parallel magnetization state (GP) of MTJ device 24 may be independent of temperature. In other words, the conductance of MTJ device 24 may not change over temperature if MTJ device 26 is configured in the parallel magnetization state.

The conductance of MTJ device 24 in anti-parallel magnetization state (GAP) increases monotonically with increasing temperature. Accordingly, the dependence of the conductance of MTJ device 24, in an anti-parallel magnetization state, on temperature can be used to measure temperature. In the parallel state, a magnetization direction of a first layer and a second layer of the MTJ device 24 is the same, and in the anti-parallel state, a magnetization direction of a first layer and a second layer of the MTJ device 24 is different.

Accordingly, this disclosure describes an example of a device that includes a spintronic component (e.g., STT-MTJ device 24) used for determining a temperature of the device. The conductance of the spintronic component is based on the temperature of the device.

Figure 4:
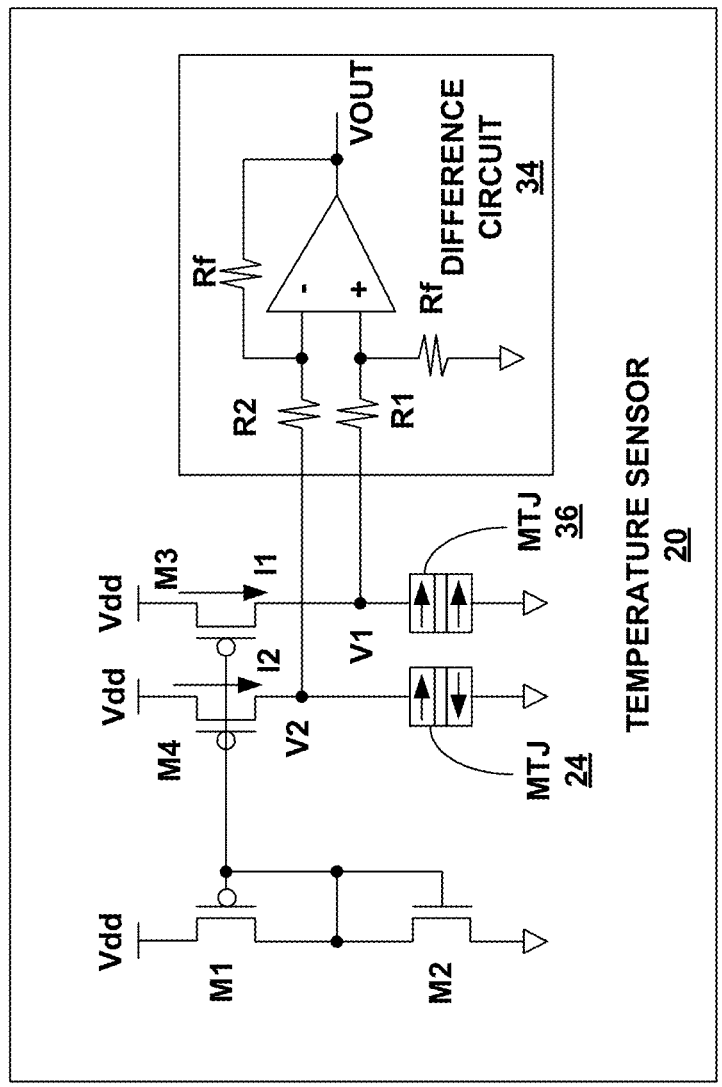
FIG. 4 is a block diagram illustrating another example temperature sensor in accordance with this disclosure.

FIG. 4 is a block diagram illustrating another example temperature sensor in which multiple spintronic components are incorporated within the sensor in accordance with this disclosure. For example, FIG. 4 is a schematic of temperature sensor 20 based on two MTJ devices 24, 36. The example illustrated in FIG. 4 may compensate for temperature variations in the circuitry needed to generate the current that flows through MTJ device 24.

For example, as illustrated in FIG. 2, current source 22 generates the current that flows through MTJ device 24. However, in some examples, the operations of the MP1 and MN1 transistors of current source 22 may depend upon the sensed temperature.

As an example, the threshold voltage at which MP1 and MN1 transistors conduct may change over temperature. By using two MTJ devices 24, 36 to determine two voltages, and then subtracting the voltages, any effect of the transistors due to temperature may be minimized. Additional spintronic components may be used than MTJ devices 24, 36 to minimize effects of the transistors due to temperature.

For instance, as illustrated in FIG. 4, current I2 flows through MTJ device 24, and current I1 flows through MTJ device 36. MTJ device 36 may be substantially similar to MTJ device 24; however, MTJ device 36 may be configured in a parallel magnetization state (e.g., the magnetization direction of the free layer and fixed layer of MTJ device 36 is in the same direction). Transistors M1, M2, and M4 may generate current I2, and transistors M1, M2, and M3 may generate current I1. For example, transistor M4 may mirror the current flowing through transistors M1 and M2 as current I2, and transistor M3 may mirror the current flowing through transistor M1 and M2 as current I1.

The flow of current I2 through MTJ 24 generates voltage V2, as illustrated. The flow of current I1 through MTJ 26 generates voltage V1, as illustrated. Difference circuit 34 may determine the difference between V2 and V1 (e.g., determine V1−V2). For example, $V_{OUT}$ from difference circuit 34 is proportional to the (V1−V2).

Difference circuit 34 includes an operational amplifier, and resistors R1, R2, and Rf, as illustrated. In examples where amplifier 32 of FIG. 2 is a difference amplifier, difference circuit 34 may replace amplifier 32 in FIG. 2. Difference circuit 34 is one example way in which to determine the difference between V1 and V2. Other examples of difference circuits are possible.

In FIG. 4, because MTJ device 36 is in the parallel magnetization state, and as described above with respect to FIG. 3, the conductance of MTJ device 36 is constant over temperature. However, the operation of transistors M1, M2, and M3 may be dependent upon temperature. Therefore, any variation in the voltage level of V1 over temperature may be due to transistors M1, M2, and M3.

MTJ device 24 is in the anti-parallel magnetization stage, and therefore, the conductance of MTJ device 24 is a function of temperature. Also, the operation of transistors M1, M2, and M4 may be dependent upon temperature. Therefore, any variation in the voltage level of V2 over temperature may be due to change in conductance of MTJ device 24 and due to transistors M1, M2, and M4.

If transistors M3 and M4 are substantially the same, including identical, then transistors M3 and M4 may exhibit the same behavior due to changes in the sensed temperature. Accordingly, by subtracting voltage V2 from voltage V1, the effect on the voltage level of V1 and V2 due to transistors M1, M2, M3, and M4 may be minimized. The result of the subtraction is indicative a voltage signal indicative of the change in the conductance of MTJ device 24, which changes due to temperature. Therefore, the voltage signal $V_{OUT}$ of difference circuit 34 is indicative of the sensed temperature.

In FIG. 4, a differential circuit 34 is used to minimize the temperature dependence on threshold voltage (Vth) of the MOS transistors M1, M2, M3, and M4. Temperature sensor 20 may show a linear sensitivity over a wide temperature range. Two MTJ devices 24, 36 are used in the design. MTJ device 24 is in anti-parallel magnetization state while MTJ device 36 is in parallel magnetization state. The voltage difference between V1 and V2 is amplified using the differential amplifier (e.g., difference circuit 34). Accordingly, any variations from MTJ technology may be cancelled by the differentiate manipulation.

In this manner, FIG. 4 illustrates an example of a device that includes MTJ device 24 (e.g., a first spintronic component) and MTJ device 36 (e.g., a second spintronic component). In this example, a first current source (e.g., I2) is configured to output a first current through the first spintronic component generating a first voltage (V2), where the first voltage is based on the conductance of the first spintronic component. In this example, a second current source (e.g., I1) is configured to output a second current through the second spintronic component generating a second voltage (V1), where the second voltage at the second STT-MTJ device is based on the conductance of the second STT-MTJ device. The circuitry (e.g., R1, R2, Rf, and the op-amp) may be configured to receive the first voltage and the second voltage and generate the electrical signal (e.g., VM) indicative of temperature at the device based on the first voltage and the second voltage.

Figure 5:
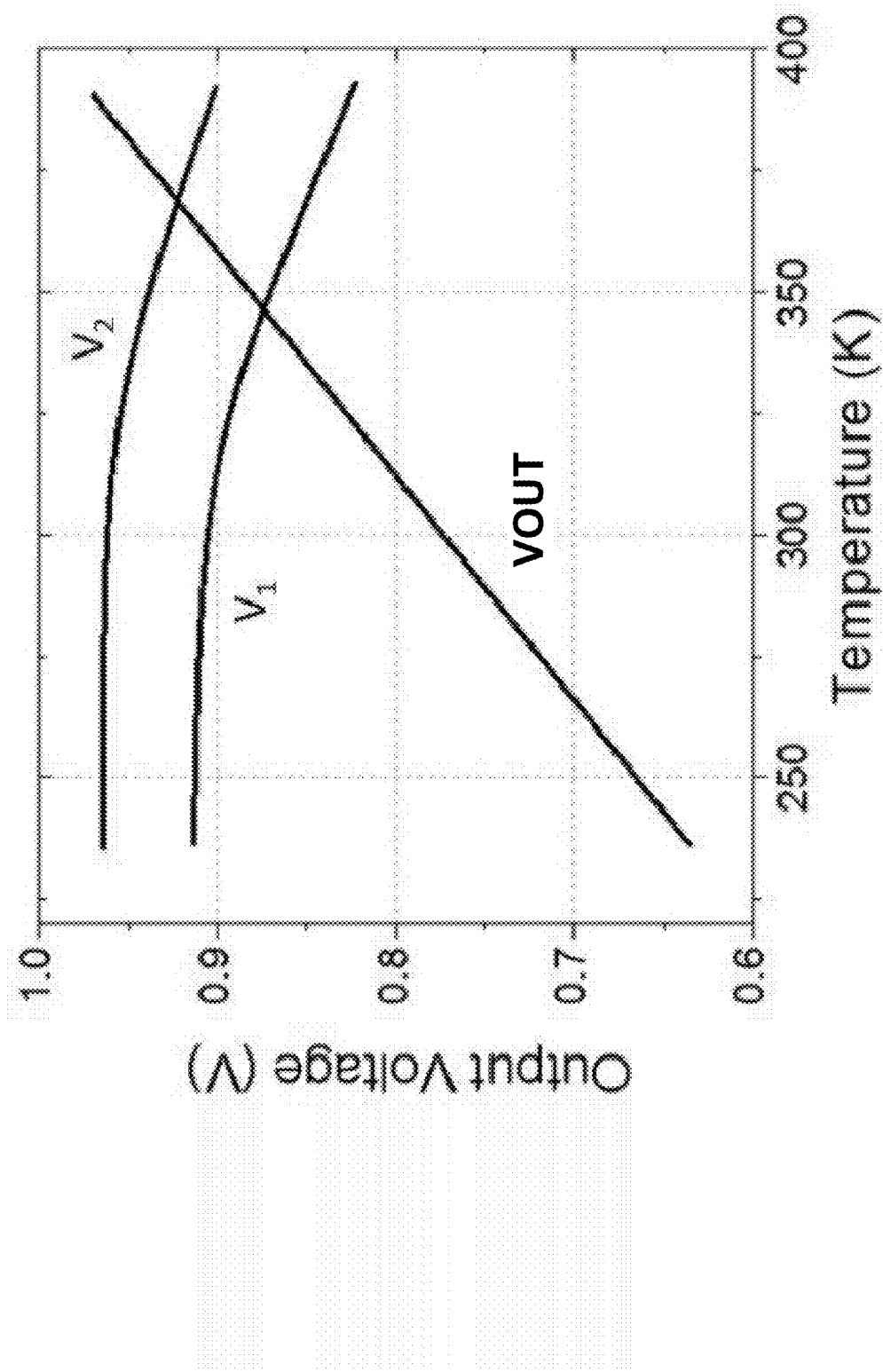
FIG. 5 is a graph illustrating output voltage of the temperature sensor of FIG. 4 versus temperature.

FIG. 5 is a graph illustrating an output voltage of the temperature sensor of FIG. 4 versus temperature. Simulation is performed to verify the correct function of the temperature sensor 20, as shown in FIG. 5, showing a wide range of linear relationship between the output signal $V_{OUT}$ and the temperature. In the example illustrated in FIG. 5, the voltage V2 is a function of temperature behavior of the transistors and the conductance of MTJ device 24 over temperature. The voltage V1 is a function of temperature behavior of the transistors. $V_{OUT}$ is based on V1−V2, and as illustrated increases over temperature. This is because the conductance of MTJ device 24 increases over temperature, meaning lower resistance. Because the resistance of MTJ device 24 is decreasing over temperature, the voltage V2 is decreasing over temperature. Accordingly, V1−V2 increases over temperature. Because $V_{OUT}$ is proportional to V1−V2, $V_{OUT}$ is shown as increasing over temperature in FIG. 5.

Figure 6:
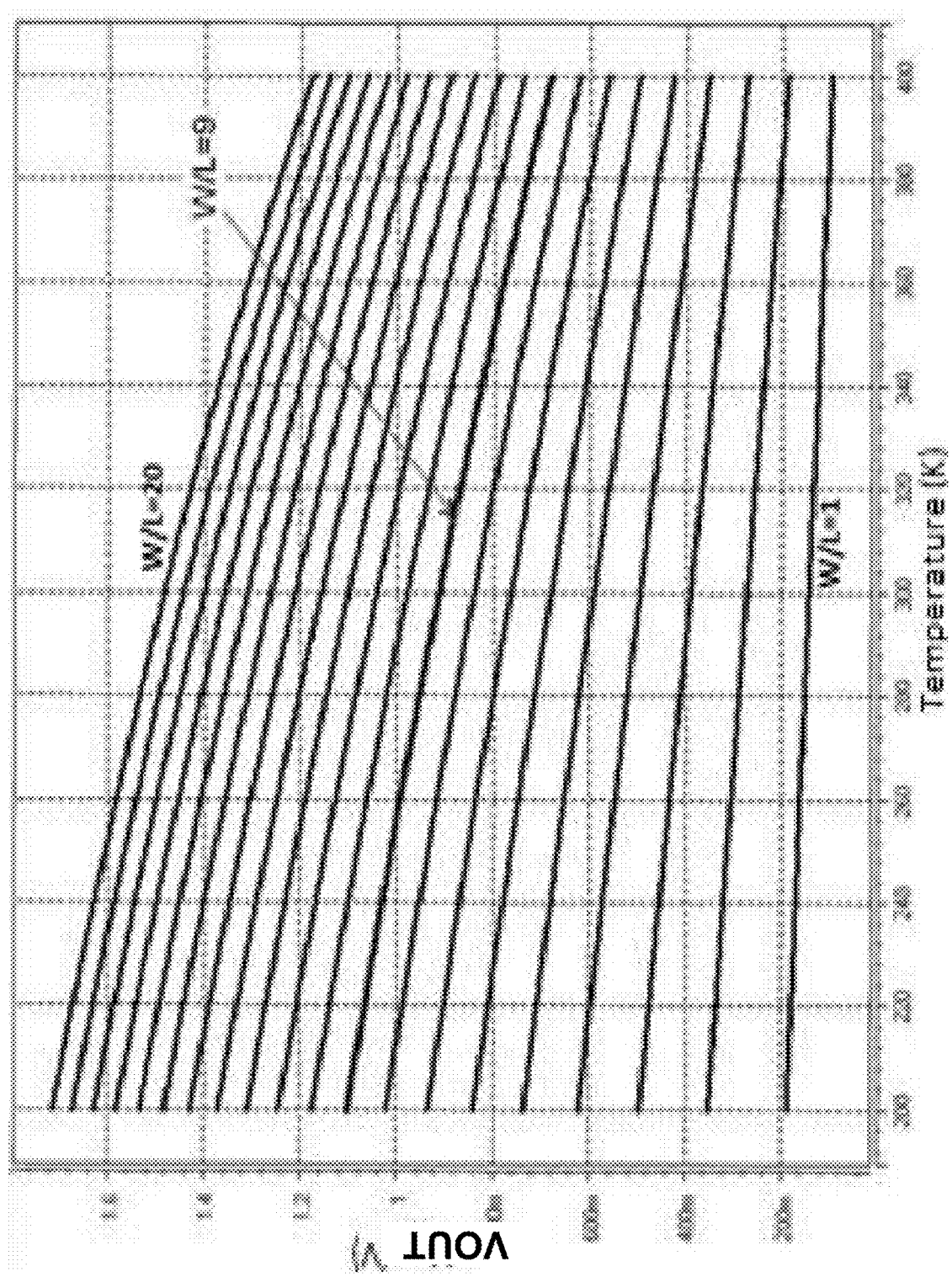
FIG. 6 is a graph illustrating output voltage versus temperature at different W/L ratios.

FIG. 6 is a graph illustrating output voltage versus temperature at different W/L ratios. For example, transistors M1, M2, M3, and M4 of FIG. 4 may be defined by their widths (W) and lengths (L). By properly sizing the transistors M1, M2, M3, and M4 (e.g., selecting the proper W/L ratio) in temperature sensor 20, and choosing the resistor values for resistors R1, R2, and Rf to ensure a proper gain, temperature sensor 20 can be designed to have sufficient linear sensitivity.

As shown in FIG. 6, the changing rate of the output voltage, $V_{OUT}$, over temperature, T, is determined by W/L of transistor in current mirror circuit (e.g., transistors used to make the I1 and I2 currents in FIG. 4). FIG. 6 shows the simulation result of the relationship between $V_{OUT}$ and temperature for a range of 200K-400K with W/L ratios varied from 1 to 20. For a transistor with a W/L ratio of 9, the voltage-temperature ratio is simulated to be −2 mV/K.

Figure 7:
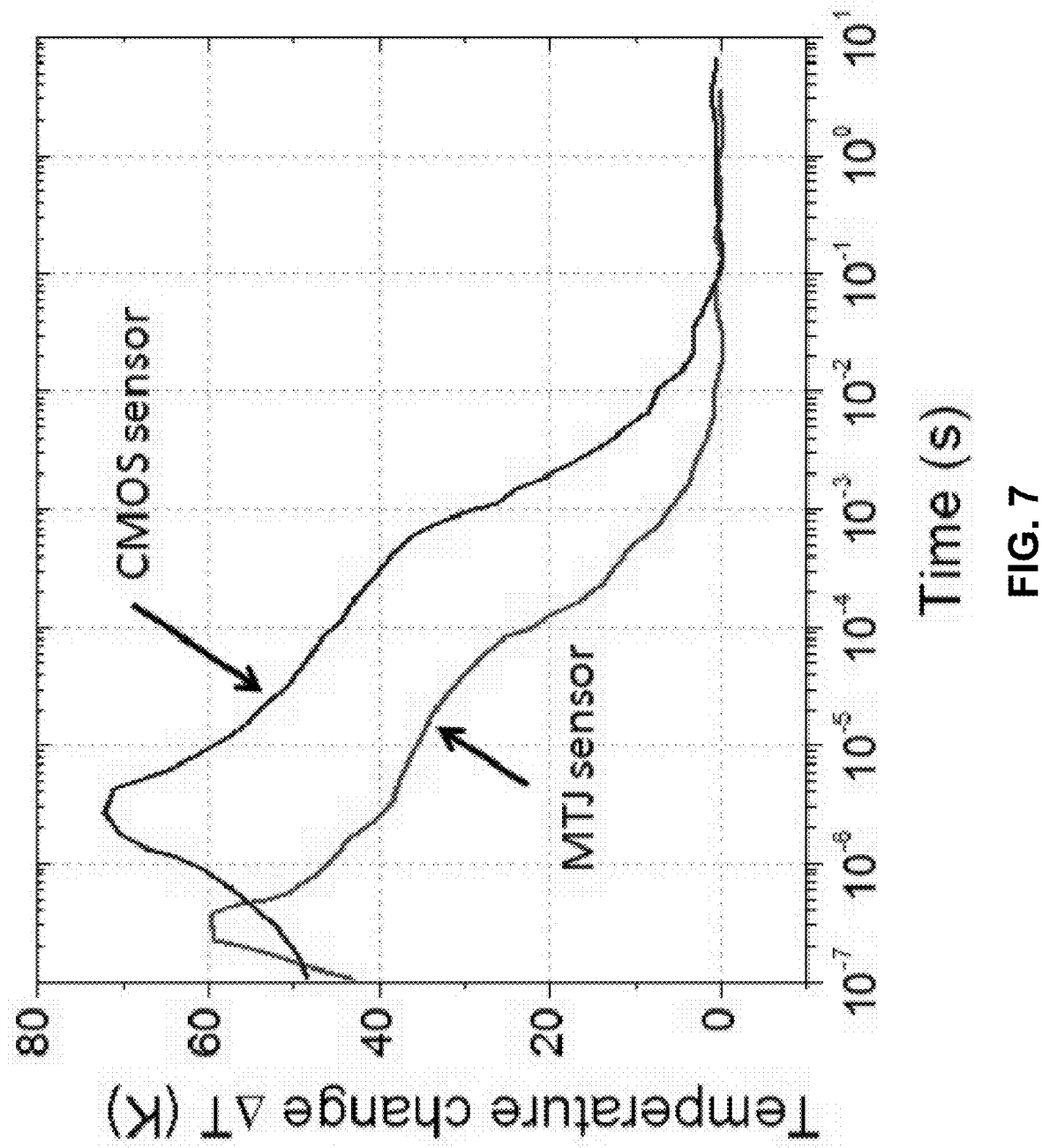
FIG. 7 is a graph illustrating response time of thermal transient measurement.

FIG. 7 is a graph illustrating response time of thermal transient measurement. As described above, temperature sensor 20 based on spintronic components such as MTJ device 24 may have a short response time to temperature changes as compared to CMOS based temperature sensors. FIG. 7 shows the measured thermal transient response of the MTJ thermal sensor (e.g., temperature sensor 20). As shown in FIG. 7, the input is driven with positive voltage (e.g., device 10 is given power causing it to heat) and, as illustrated in FIG. 7, there is a positive peak in the response of thermal transient measurement. The scenario happens for both MTJ sensor (e.g., temperature sensor 20) and CMOS BJT sensor. In FIG. 7, the thermal transient time for MTJ sensor is about 0.5 ns, while the time of CMOS sensor is 6 nano-seconds (ns). The speed of thermal transient response of the MTJ sensor is ten times faster than that of CMOS sensor. This fast-thermal transient property may be for some examples of MTJ thermal sensor. One possible reason for this high response speed is that the mechanism of thermal transportation of MTJ device 24 is spin-wave excitation. In some examples, the transient time is less than 1 ns. For example, MTJ device 24 may be configured such that a change in conductance of MTJ device 24 occurs in less than 1 ns responsive to a change in the sensed temperature.

As described above, a voltage at MTJ device 24 may be based on the sensed temperature. In some examples, MTJ device 24 may generate the voltage in less than 1 ns responsive to a change in the sensed temperature.

For instance, the switching time t of MTJ device 24 (e.g., time it takes MTJ device 24 to change conductance based on change in temperature) is given by the following equation:

$$t=\ln(pi/(2*alpha))/(abs(I-Ic0)),$$

where alpha is an initial angle between magnetizations and set by thermal fluctuations or magnetic pinning, Ic0 is critical current at temperature=0, and I is the current through MTJ device 24.

As can be seen, one way to reduce the switching time (e.g., make MTJ device 24 react to temperature changes even faster) is to increase the amplitude of I (i.e., the current through MTJ device 24, which is current I2 in FIG. 4). Since the amplitude I is in the denominator of the equation and Ic0 is subtracted from I, increasing I would reduce the value of "t." Simulation shows that by changing the amplitude of the current I2, the switching time may be reduced to 3.31 ns, 2.5 ns, 1.87 ns, or 1.03 ns, and even less than 1 ns, as a few examples. Example current amplitudes for I2 include 3.4 mA, 4.8 mA, and 6.6 mA. Accordingly, the thermal switching may be in nano-seconds at suitable pulse amplitude of current I. For instance, the amplitude of current I should not be so large as to reset the magnetization state of MTJ device 24 to parallel magnetization state.

Table 1 below is a comparison between use of MTJ device 24 and CMOS BJT sensor.

TABLE 1

Comparison between MTJ sensor and CMOS BJT sensor

|  | Temperature Range | Inaccuracy | Thermal transit time |
| --- | --- | --- | --- |
| MTJ sensor | −100~200° C. | 0.5~0.6° C. | 0.5 ns |
| CMOS BJT sensor | −50~120° C. | 0.3~0.5° C. | 5~6 ns |

Figure 8:
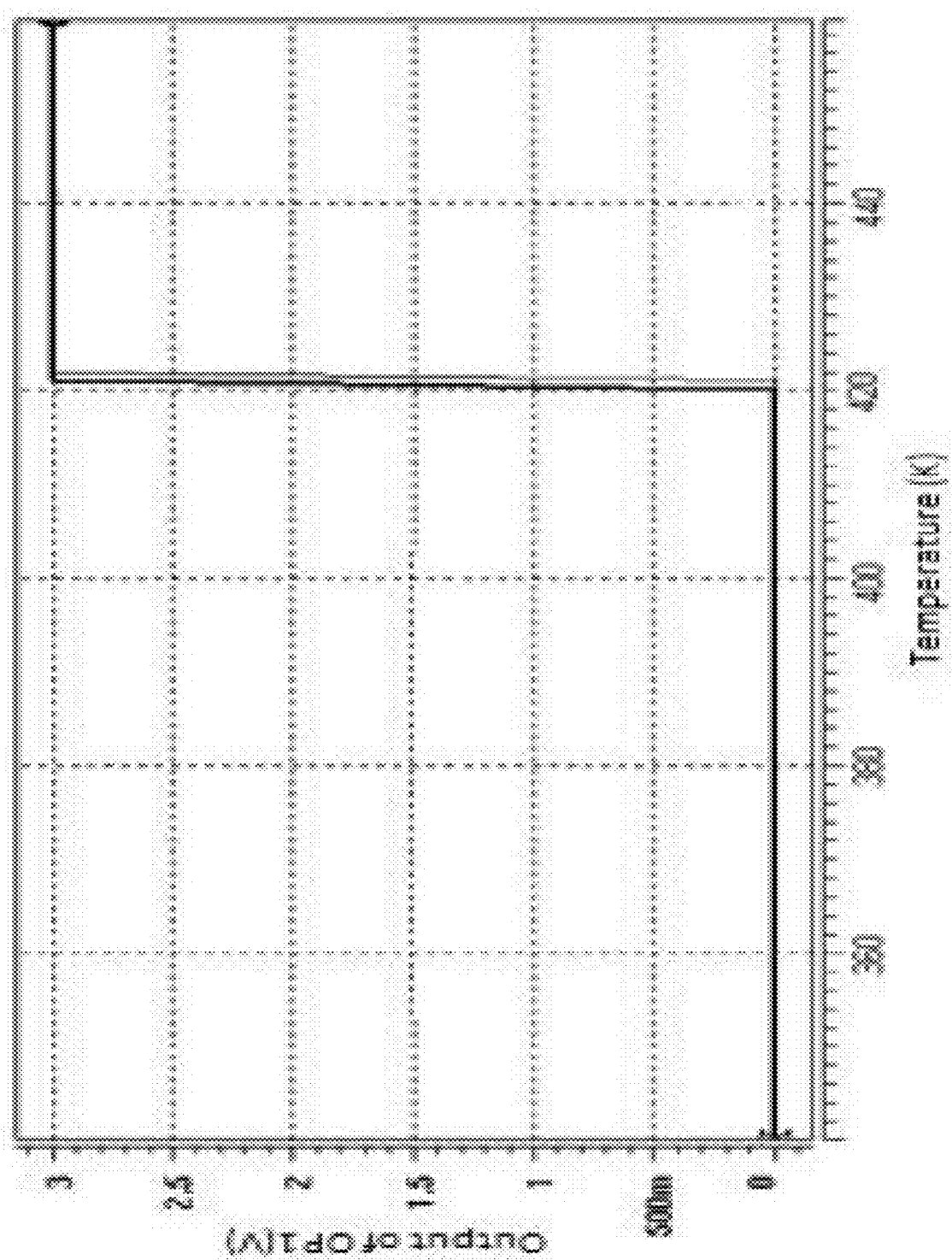
FIG. 8 is a simulation result of overheat cut-off protection.

FIG. 8 is a simulation result of overheat cut-off protection. With its fast-thermal response speed, the example temperature sensor 20 may be adopted directly as an overheat protector. For instance, as described above, temperature sensor 20 may control whether voltage regulator 18 delivers power to the other controlled circuits. If device 10 overheats, temperature sensor 20 may cause to voltage regulator 18 to turn off power relatively quickly because of the fast-thermal response time of MTJ device 24. FIG. 8 shows the simulation result of overheat protection using the STT-MTJ device 24 by temperature sweeping, indicating that the protection circuit (e.g., control of voltage regulator 18) can be operated without any lag and thermal oscillation. In some cases, the property of fast thermal transient response of MTJ device 24 may reduce the active power consumption of IC circuit (e.g., device 10), and hence to control the die temperature in an effective way.

In some examples, MTJ device 24 is prepared by using a magnetron sputtering system and patterned with photolithography. MTJ device 24 is then etched using an argon ion milling process and electrodes are deposited using an electron beam evaporation process. In this example, the complete structure of MTJ device 24 was Ta 2 nm/(Al 10 nm/Cu 3 nm)(5)/Al 5 nm/Ta 3 nm/Ru 3 nm/IrMn 10 nm/CoFe 2.5 nm/Ru 0.8 nm/CoFeB 3 nm/MgO (0.7 nm-2.5 nm)/CoFeB 3 nm/Ru 3 nm/Ta 10 nm/Ru 7 nm and the size of the fabricated devices was 2 μm×6 μm.

Resistance value of MTJ device 24 could be adjusted by tuning the thickness of tunneling barrier MgO. For example, the sensitivity of MTJ device 24 (e.g., change in conductance in response to a change in temperature) can be adjusted by tuning the thickness of the MgO layer. As one example, if the MgO layer is made thinner, the resistance of MTJ device 24 is decreased (e.g., conductance is increased), and if the MgO layer is made thicker, the resistance of MTJ device 24 is increased (e.g., conductance is decreased). Therefore, an amount of change in the conductance of MTJ device 24 due to a change in the sensed temperature is based on a thickness of the MgO layer.

For instance, the sensitivity of temperature sensor 20 may be based on the thickness of the MgO layer. The sensitivity of temperature sensor 20 may be a measure of how small of changes in the temperature can be sensed by temperature sensor 20. If small changes in the sensed temperature result in greater change in the conductance of MTJ device 24, as compared to less change in the conductance of MTJ device 24, then the sensitivity of temperature sensor 20 may be considered as being more sensitive to temperature changes. As an example, if the change in temperature is X, then the change in conductance of MTJ device 24 may be Y for a first thickness of the MgO layer, and the conductance of MTJ device 24 may be Z for a second thickness of the MgO layer. Y may be greater than Z, and the first thickness may be less than the second thickness. In this manner, MTJ device 24 may be configured for different sensitivities of temperature sensor 20. As another example, the thickness of the MgO layer may control the slope of the conductance versus temperature line for MTJ device 24 being in the anti-parallel state as illustrated in FIG. 3.

Figure 9A:
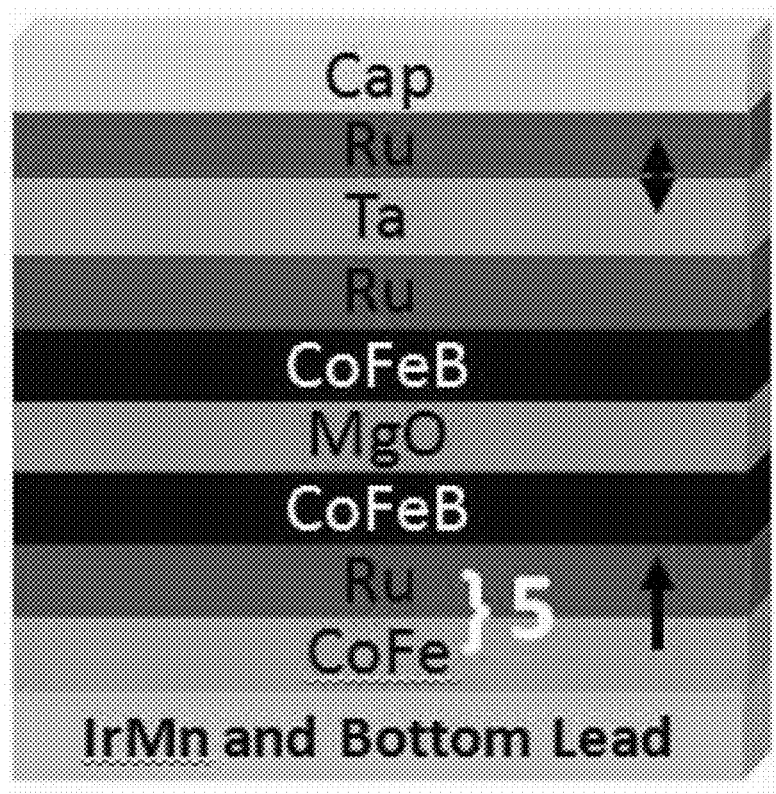
FIG. 9A is a structure of an example of an MTJ device configured such that a conductance of the MTJ device is based on sensed temperature for a temperature sensor.
Figure 9B:
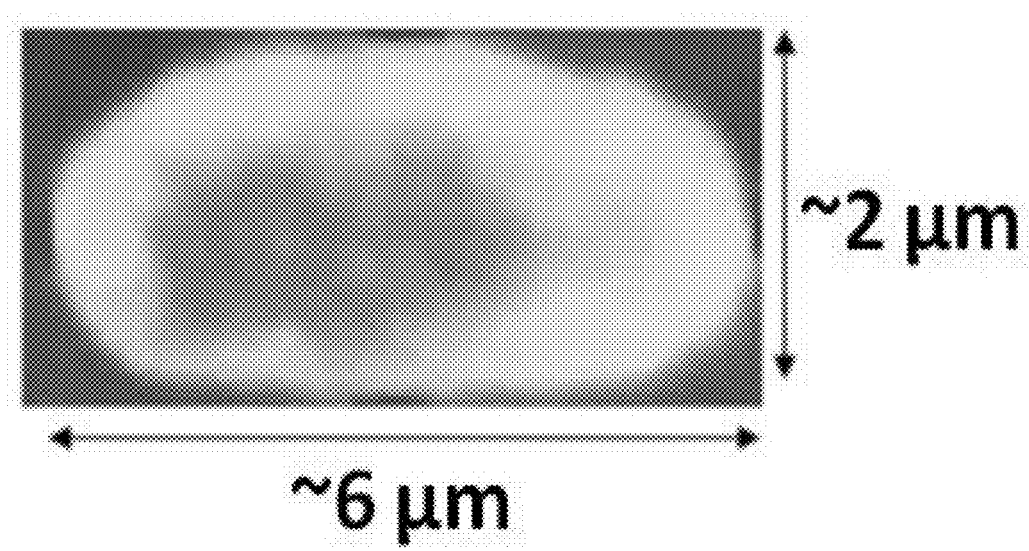
FIG. 9B is a diagram from a scanning electron microscope (SEM) of an MTJ device for a temperature sensor.

FIG. 9A is a structure of MTJ device 24 for temperature sensor 20 configured such that a conductance of MTJ device 24 is based on sensed temperature, and FIG. 9B is a diagram from a scanning electron microscope (SEM) of MTJ device 24 for temperature sensor 24. Hence, the structure of the MTJ device and related SEM picture are shown in FIGS. 9A and 9B. The magnetic properties are measured in a physical properties measurement system (PPMS) using a standard four-probe technique with a sensing current of 0.05 mA.

The above example structure of MTJ device 24 used for temperature sensor 20 is merely one example, and the techniques described in this disclosure should not be considered limited to those examples. For example, other structures of MTJ devices may be used as many MTJ devices exhibit thermal dependency. Moreover, STT-MTJ devices are one type of spintronic components, and others may be used as well including spintronic components not necessarily limited having spin torque transfer (STT) properties. As described above, other types of devices such as giant magnetoresistance (GMR) devices may be possible, including STT-GMR devices.

Figure 10A:
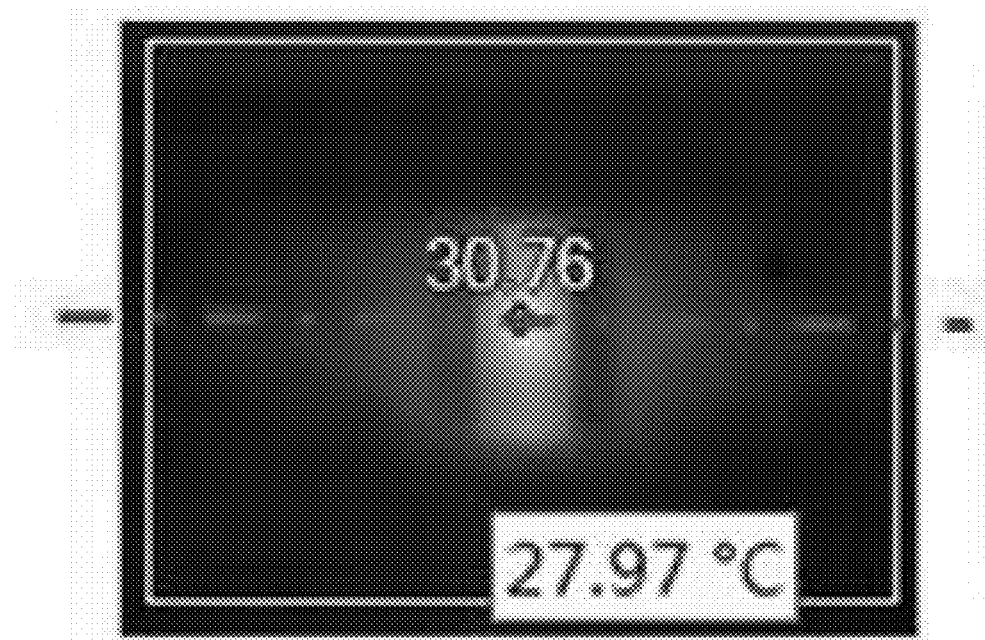
FIG. 10A is a stand-by state measurement of IC surface temperature.
Figure 10B:
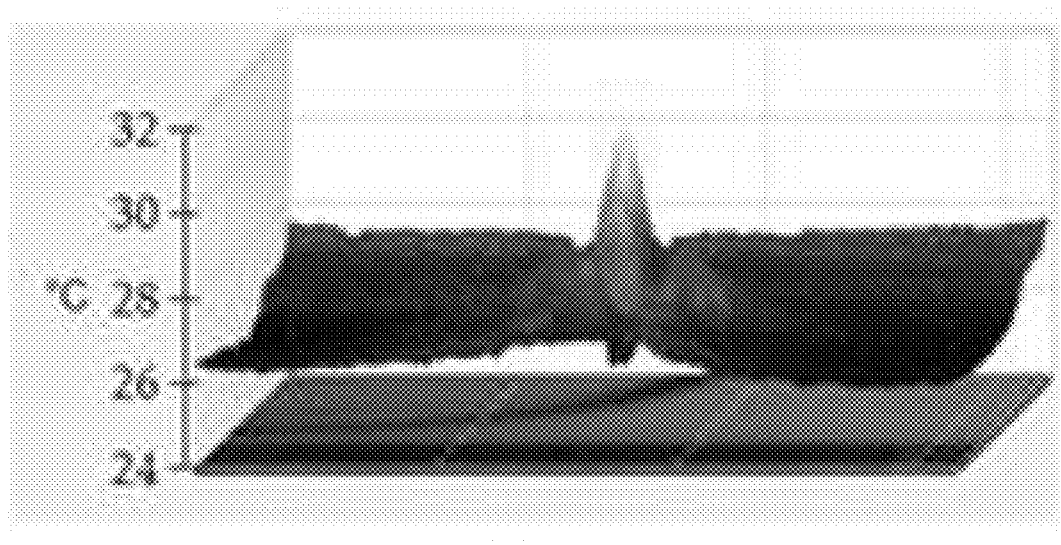
FIG. 10B is a temperature profile along the line in FIG. 10A.
Figure 10C:
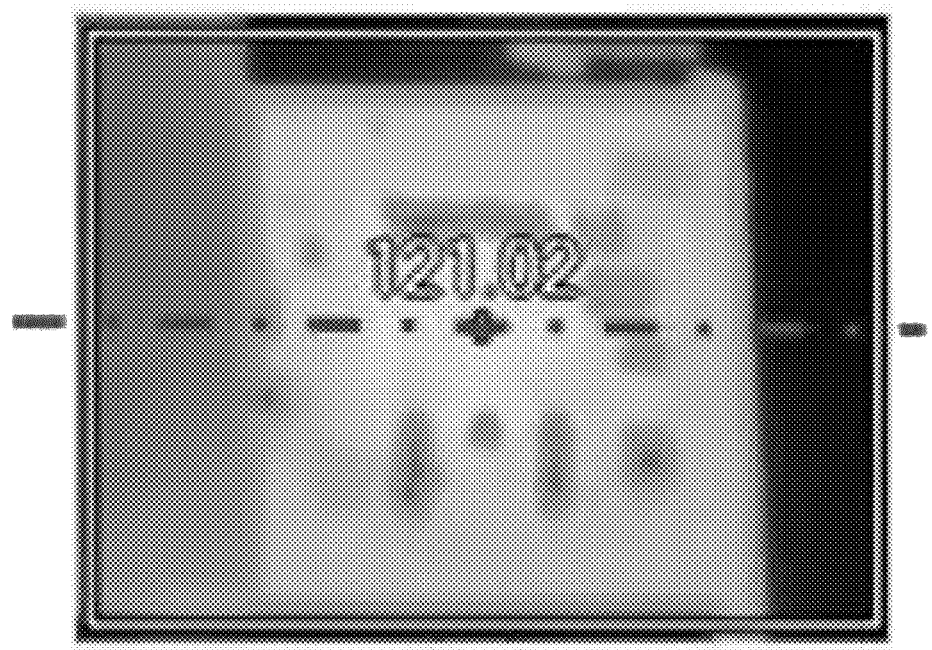
FIG. 10C is a full loading state measurement of IC surface temperature.
Figure 10D:
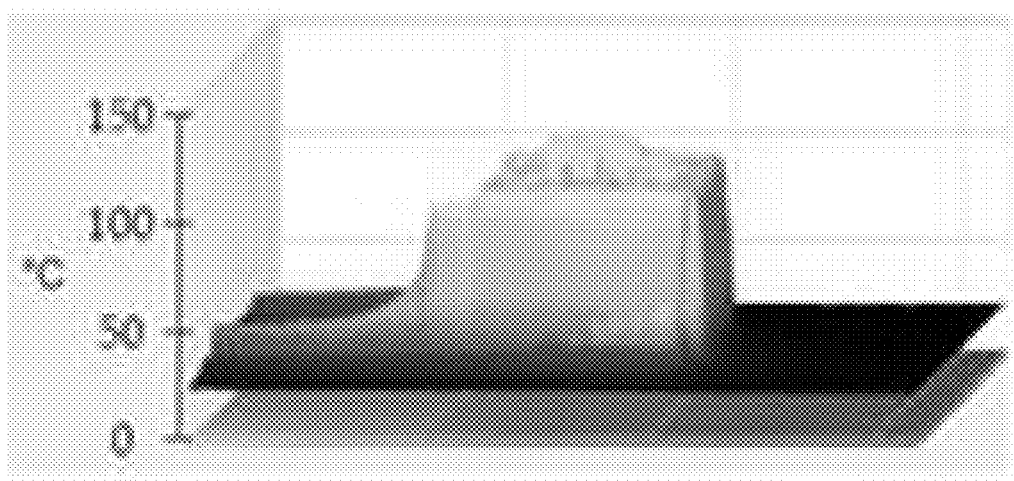
FIG. 10D is a temperature profile along the line in FIG. 10C.
Figure 10E:
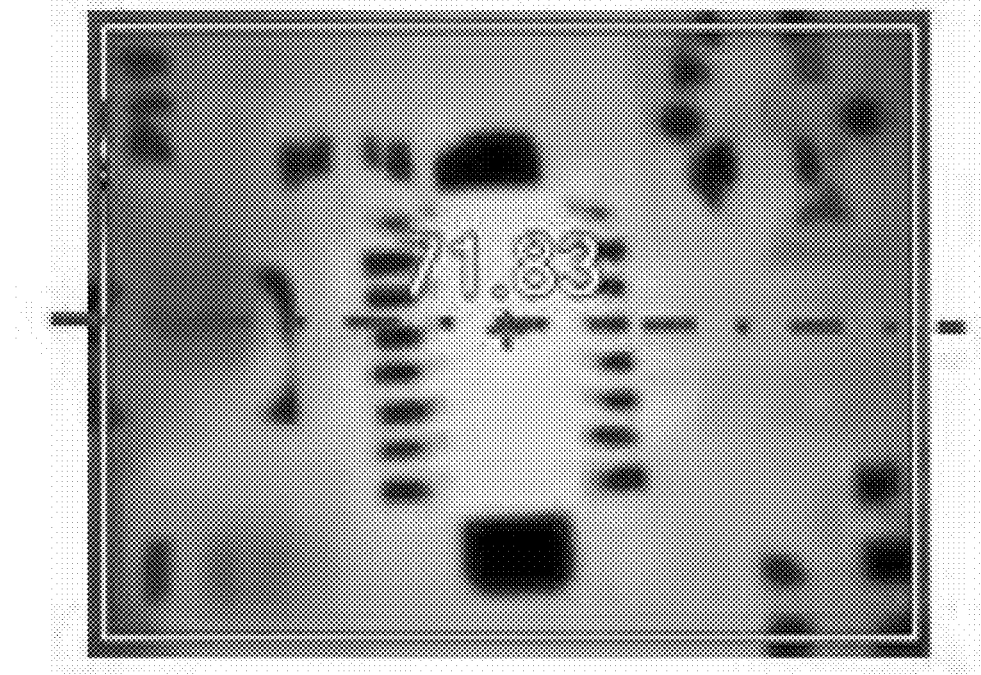
FIG. 10E is a full loading with MTJ temperature sensor.
Figure 10F:
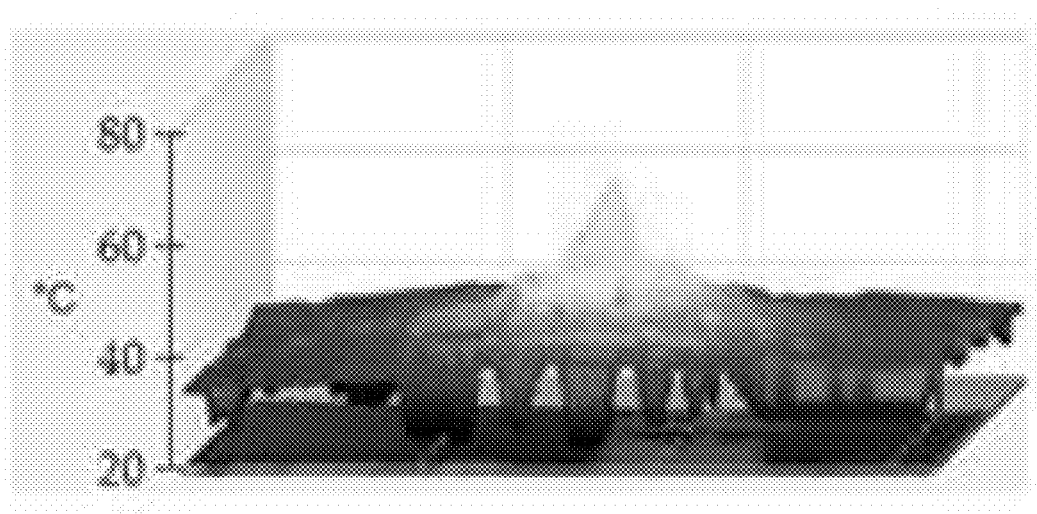
FIG. 10F is a temperature profile along the line in FIG. 10E.

The following provides the results on the package temperature with the MTJ thermal sensor (e.g., temperature sensor 20) as the input of supply voltage regulator 18. For the driver IC with stand-by mode, its temperature profile is shown in FIG. 10A and FIG. 10B, showing maximum temperature 30.76° C. When the driver (e.g., example where device 10 is a power driver IC) is working in full-loading state, as shown in FIG. 10C and FIG. 10D, its surface temperature increased dramatically. The maximum temperature reached is 121.02° C., which may have negative impacts on the IC. However, as shown in FIG. 10E and FIG. 10F, by utilizing temperature sensor 20 having spintronic component (e.g., MTJ device 24) as input of supply voltage regulator 18, the temperature is decreased. The maximum temperature with regulation from temperature sensor 20 is 71.83° C.

Figure 11:
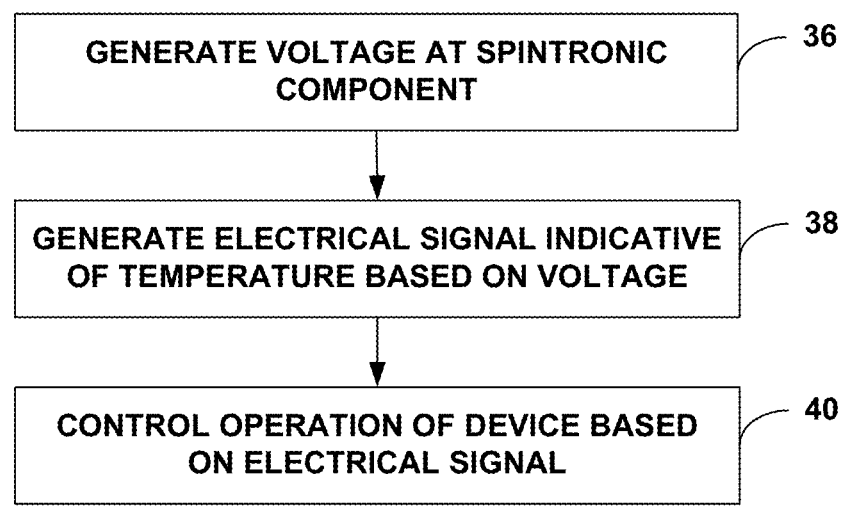
FIG. 11 is a flowchart illustrating an example method of operation in accordance with this disclosure.

FIG. 11 is a flowchart illustrating an example method of operating in accordance with this disclosure. For ease of illustration, the example of FIG. 11 is described with respect to FIGS. 2 and 4.

For example, a current source may output a current through a spintronic component that generates a voltage at the spintronic component (36). The voltage at the spintronic component is based on a sensed temperature. The spintronic component is configured such that a conductance of the spintronic component is based on the sensed temperature. Examples of the spintronic component include MTJ device 24, which may be an example of a STT-MTJ device.

In the example of FIG. 2, current source 22 may output a current through MTJ device 24 to generate a voltage at node 25, where the voltage at node 25 is based on the conductance of MTJ device 24. In the example of FIG. 4, transistor M4 may mirror the current flowing through transistors M1 and M2 to output a current I2 through MTJ device 24 to generate a voltage V2.

Circuitry may generate an electrical signal indicative of the sensed temperature (e.g., temperature proximate to the spintronic component such as that of device 10) based on the voltage at the spintronic component (38). For example, in FIG. 2, amplifier 32 may output $V_{OUT}$, which is an electrical signal indicative of the sensed temperature based on the voltage at node 25. In FIG. 4, transistor M3 may mirror the current flowing through transistors M1 and M2 to output a current I1 through MTJ device 36 to generate a voltage V1. As described above, MTJ device 36 may be configured in a parallel magnetization state. Difference circuit 34 may subtract V2 from V1 (e.g., determine V1−V2). The result may be the electrical signal indicative of the sensed temperature.

Voltage regulator 18 may control operation of an electronic device 10 based on the generated electrical signal (40). For example, voltage regulator 18 may control the voltage applied to one or more controlled circuits of electronic device 10 based on the generated electrical signal. As one example, voltage regulator 18 may scale a supply voltage based on the generated electrical signal from temperature sensor 20 to limit the power delivered to the controlled circuits, thereby cooling the controlled circuits. As another example, voltage regulator 18 may stop delivery of supply voltage based on the generated electrical signal from temperature sensor 20 to stop the operation of electronic device 10.

Various aspects of the disclosure have been described. These and other examples are within the scope of the following claims.

What is claimed is:

1. An electronic device comprising:
 a spintronic component configured such that a conductance of the spintronic component is based on a sensed temperature, wherein the spintronic component comprises a spin torque transfer-operated magnetic tunnel junction (STT-MTJ) device, and wherein the STT-MTJ device is configured in a first state, wherein the conductance of the STT-MTJ device is based on the sensed temperature when the STT-MTJ device is configured in the first state, and wherein the conductance of the STT-MTJ device is not based on the sensed temperature when the STT-MTJ device is configured in a second state; and circuitry coupled to the spintronic component and configured to generate an electrical signal indicative of the sensed temperature based on the conductance of the spintronic component.

2. The device of claim 1, wherein the first state is an anti-parallel magnetization state, and wherein in the anti-parallel magnetization state, a magnetization direction of a first layer and a second layer of the STT-MTJ device is different.

3. The device of claim 1, further comprising:
a temperature sensor comprising the spintronic component and the circuitry;
one or more controlled circuits; and
a voltage regulator configured to control voltage applied to the one or more controlled circuits,
wherein the circuitry of the temperature sensor is configured to output the electrical signal indicative of the sensed temperature to the voltage regulator, and the voltage regulator is configured to control the voltage applied to the one or more controlled circuits based on the received electrical signal from the temperature sensor.

4. The device of claim 1, wherein the device comprises an integrated circuit (IC) that includes at least one of transistors or spintronic based components.

5. The device of claim 1, wherein the spintronic component is configured such that a change in conductance of the spintronic component occurs in less than 1 nano-second responsive to a change in the sensed temperature.

6. The device of claim 1, wherein the spintronic component includes a MgO layer, and wherein an amount of change in the conductance of the spintronic component from a change in the sensed temperature is based on a thickness of the MgO layer.

7. The device of claim 1, wherein the spintronic component includes a MgO layer having a thickness of at least 0.7 nano-meters.

8. The device of claim 1, wherein the spintronic component includes a MgO layer having a thickness between 0.7 nano-meters and 2.5 nano-meters.

9. The device of claim 1, further comprising:
a current source configured to output a current through the spintronic component generating a voltage at the spintronic component, wherein the voltage at the spintronic component is based on the conductance of the spintronic component,
wherein the circuitry is configured to receive the voltage at the spintronic component and generate the electrical signal indicative of the sensed temperature.

10. The device of claim 9, further comprising a reference voltage to calibrate the voltage at the spintronic component, wherein the circuitry is configured to receive the voltage at the spintronic component and the reference voltage and generate the electrical signal indicative of the sensed temperature.

11. The device of claim 1, wherein the spintronic component comprises a first spintronic component configured in an anti-parallel magnetization state, and wherein in the anti-parallel magnetization state, a magnetization direction of a first layer and a second layer of the first spintronic component is different, the device further comprising:
a first current source configured to output a first current through the first spintronic component generating a first voltage at the first spintronic component, wherein the first voltage at the first spintronic component is based on the conductance of the first spintronic component;

a second spintronic component configured in a parallel magnetization state, wherein in the parallel magnetization state, a magnetization direction of a first layer and a second layer of the second spintronic component is same; and
a second current source configured to output a second current through the second spintronic component generating a second voltage at the second spintronic component, wherein the second voltage at the second spintronic component is based on a conductance of the second spintronic component,
wherein the circuitry is configured to receive the first voltage and the second voltage and generate the electrical signal indicative of the sensed temperature based on the first voltage and the second voltage.

12. The device of claim 11, wherein the circuitry is configured to subtract the first voltage from the second voltage to generate the electrical signal indicative of the sensed temperature.

13. A method for temperature sensing, the method comprising:
generating a first voltage at a first spintronic component based on a sensed temperature, wherein the first spintronic component is configured in an anti-parallel magnetization state such that a conductance of the first spintronic component is based on the sensed temperature, and wherein in the anti-parallel magnetization state, a magnetization direction of a first layer and a second layer of the first spintronic component is different;
generating a second voltage at a second spintronic component, wherein the second voltage at the second spintronic component is based on a conductance of the second spintronic component, wherein the second spintronic component is configured in a parallel magnetization state, wherein in the parallel magnetization state, a magnetization direction of a first layer and a second layer of the second spintronic component is same;
receiving the first voltage and the second voltage;
generating an electrical signal indicative of the sensed temperature based on the first voltage and the second voltage; and
controlling operation of an electronic device based on the generated electrical signal.

14. The method of claim 13, wherein generating the electrical signal comprises:
subtracting the first voltage from the second voltage; and
generating the electrical signal based on the subtraction of the first voltage from the second voltage.

15. The method of claim 13, wherein controlling operation of the electronic device based on the generated electrical signal comprises causing a voltage regulator to control the voltage applied to one or more controlled circuits of the electronic device based on the generated electrical signal.

16. The method of claim 13, wherein the first spintronic component and the second spintronic component each comprises at least one of a spin Hall effect operated MTJ device, a Rashiba effect operated MTJ device, a voltage controlled magnetic anisotropy effect (VCMA) operated MTJ device, a magento-electric (ME) effect operated MTJ device, and a topological insulator-based MTJ device.

17. The method of claim 13, wherein generating the first voltage at the first spintronic component comprises generating the first voltage in less than 1 nano-second responsive to a change in the sensed temperature.

18. The method of claim 13, wherein the first spintronic component includes a MgO layer, wherein generating the first voltage comprises generating the first voltage based on a thickness of the MgO layer, and wherein an amount of change in the conductance of the first spintronic component from a change in the sensed temperature is based on the thickness of the MgO layer.

19. The method of claim 13, wherein the first spintronic component includes a MgO layer having a thickness of at least 0.7 nano-meters.

20. The method of claim 13, wherein the first spintronic component includes a MgO layer having a thickness between 0.7 nano-meters and 2.5 nano-meters.

21. The method of claim 13, wherein the first spintronic component and the second spintronic component each comprises a magnetic tunnel junction (MTJ) device.

22. The method of claim 21, wherein the first spintronic component and the second spintronic component each comprises a spin torque transfer (STT) operated MTJ device.

23. An electronic device comprising:
a first spintronic component configured in an anti-parallel magnetization state, wherein in the anti-parallel magnetization state, a magnetization direction of a first layer and a second layer of the first spintronic component is different;
a first current source configured to output a first current through the first spintronic component generating a first voltage at the first spintronic component, wherein the first voltage at the first spintronic component is based on a conductance of the first spintronic component;
a second spintronic component configured in a parallel magnetization state, wherein in the parallel magnetization state, a magnetization direction of a first layer and a second layer of the second spintronic component is same; and
a second current source configured to output a second current through the second spintronic component generating a second voltage at the second spintronic component, wherein the second voltage at the second spintronic component is based on a conductance of the second spintronic component; and
circuitry coupled to the first spintronic component and the second spintronic component and configured to receive the first voltage and the second voltage and generate an electrical signal indicative of a sensed temperature based on the first voltage and the second voltage.

24. An electronic device comprising:
a spintronic component configured such that a conductance of the spintronic component is based on a sensed temperature, wherein the spintronic component includes a MgO layer, and wherein an amount of change in the conductance of the spintronic component from a change in the sensed temperature is based on a thickness of the MgO layer; and
circuitry coupled to the spintronic component and configured to generate an electrical signal indicative of the sensed temperature based on the conductance of the spintronic component.

25. The device of claim 24, wherein the spintronic component includes a MgO layer having a thickness of at least 0.7 nano-meters.

26. The device of claim 24, wherein the spintronic component includes a MgO layer having a thickness between 0.7 nano-meters and 2.5 nano-meters.

* * * * *